United States Patent
Loiko et al.

(10) Patent No.: US 9,257,445 B2
(45) Date of Patent: Feb. 9, 2016

(54) METHOD OF MAKING A SPLIT GATE NON-VOLATILE MEMORY (NVM) CELL AND A LOGIC TRANSISTOR

(71) Applicants: Konstantin V. Loiko, Austin, TX (US); Brian A. Winstead, Bridgetown (CA)

(72) Inventors: Konstantin V. Loiko, Austin, TX (US); Brian A. Winstead, Bridgetown (CA)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/291,224

(22) Filed: May 30, 2014

(65) Prior Publication Data

US 2015/0348985 A1  Dec. 3, 2015

(51) Int. Cl.
| | |
|---|---|
| H01L 29/49 | (2006.01) |
| H01L 27/115 | (2006.01) |
| H01L 21/285 | (2006.01) |
| H01L 29/423 | (2006.01) |
| H01L 21/28 | (2006.01) |
| H01L 29/78 | (2006.01) |
| H01L 29/66 | (2006.01) |

(52) U.S. Cl.
CPC .... *H01L 27/11568* (2013.01); *H01L 21/28282* (2013.01); *H01L 21/28525* (2013.01); *H01L 27/11573* (2013.01); *H01L 29/42344* (2013.01); *H01L 29/4916* (2013.01); *H01L 29/6656* (2013.01); *H01L 29/7843* (2013.01)

(58) Field of Classification Search
CPC ............... H01L 27/11531–27/11543; H01L 29/42312–29/42332; H01L 29/4234–29/42348
See application file for complete search history.

(56) References Cited

U.S. PATENT DOCUMENTS

| | | | |
|---|---|---|---|
| 5,614,746 | A | 3/1997 | Hong et al. |
| 6,040,216 | A * | 3/2000 | Sung .............................. 438/257 |
| 6,087,225 | A | 7/2000 | Bronner et al. |
| 6,194,301 | B1 | 2/2001 | Radens et al. |
| 6,232,185 | B1 * | 5/2001 | Wang ............................ 438/266 |
| 6,235,574 | B1 | 5/2001 | Tobben et al. |
| 6,333,223 | B1 | 12/2001 | Moriwaki et al. |
| 6,388,294 | B1 | 5/2002 | Radens et al. |
| 6,509,225 | B2 | 1/2003 | Moriwaki et al. |
| 6,531,734 | B1 | 3/2003 | Wu |

(Continued)

FOREIGN PATENT DOCUMENTS

WO  2009058486  5/2009

OTHER PUBLICATIONS

U.S. Appl. No. 13/928,666, Hong, Office Action—Rejection, mailed Jul. 23, 2014.

(Continued)

*Primary Examiner* — Laura Menz
*Assistant Examiner* — Maliheh Malek (57) ABSTRACT

Semiconductor structures and methods for making semiconductor structures include a split gate non-volatile memory (NVM) cell in an NVM region. A charge storage layer, a first conductive layer, and a capping layer are formed over the substrate, which are patterned to form a control gate stack in the NVM region of the substrate. A high-k dielectric layer, a metal layer, and a second conductive layer are formed over the substrate. The second conductive layer and the metal layer are patterned to form remaining portions of the second conductive layer and the metal layer over and adjacent to a first side of the control gate stack. The remaining portion of the second conductive layer is removed to form a select gate stack, which includes the remaining portion of the metal layer. A stressor layer is formed over the substrate.

20 Claims, 4 Drawing Sheets

(56) References Cited

U.S. PATENT DOCUMENTS

| | | | |
|---|---|---|---|
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 | 8/2004 | Kawahara et al. | |
| 6,939,767 B2 | 9/2005 | Hoefler et al. | |
| 7,154,779 B2 | 12/2006 | Mokhlesi et al. | |
| 7,183,159 B2 | 2/2007 | Rao et al. | |
| 7,190,022 B2 | 3/2007 | Shum et al. | |
| 7,202,524 B2 | 4/2007 | Kim et al. | |
| 7,208,793 B2 | 4/2007 | Bhattacharyya | |
| 7,256,125 B2 | 8/2007 | Yamada et al. | |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,456,465 B2 * | 11/2008 | Prinz | B82Y 10/00 257/315 |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,727,870 B2 * | 6/2010 | Zhang et al. | 438/589 |
| 7,795,091 B2 * | 9/2010 | Winstead et al. | 438/257 |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,838,922 B2 * | 11/2010 | Li | B82Y 10/00 257/319 |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2 | 10/2011 | Beugin et al. | |
| 8,063,434 B1 | 11/2011 | Polishchuk et al. | |
| 8,093,128 B2 | 1/2012 | Koutny et al. | |
| 8,138,037 B2 | 3/2012 | Chudzik et al. | |
| 8,163,615 B1 * | 4/2012 | White et al. | 438/257 |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 * | 3/2013 | Shroff et al. | 438/275 |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Hall et al. | |
| 8,564,044 B2 * | 10/2013 | Shroff et al. | 257/316 |
| 8,643,123 B2 * | 2/2014 | Hong et al. | 257/410 |
| 8,679,927 B2 | 3/2014 | Ramkumar et al. | |
| 8,716,089 B1 * | 5/2014 | Hall et al. | 438/287 |
| 8,901,632 B1 * | 12/2014 | Perera et al. | 257/314 |
| 8,932,925 B1 * | 1/2015 | Hong et al. | 438/261 |
| 2001/0049166 A1 | 12/2001 | Peschiaroli et al. | |
| 2002/0061616 A1 | 5/2002 | Kim et al. | |
| 2003/0022434 A1 | 1/2003 | Taniguchi et al. | |
| 2004/0075133 A1 | 4/2004 | Nakagawa et al. | |
| 2004/0185615 A1 * | 9/2004 | Ding | 438/257 |
| 2004/0262670 A1 | 12/2004 | Takebuchi et al. | |
| 2005/0145949 A1 | 7/2005 | Sadra et al. | |
| 2005/0199956 A1 * | 9/2005 | Ding | 257/365 |
| 2006/0038240 A1 | 2/2006 | Tsutsumi et al. | |
| 2006/0046449 A1 | 3/2006 | Liaw | |
| 2006/0099798 A1 | 5/2006 | Nakagawa | |
| 2006/0134864 A1 | 6/2006 | Higashitani et al. | |
| 2006/0211206 A1 | 9/2006 | Rao et al. | |
| 2006/0221688 A1 | 10/2006 | Shukuri et al. | |
| 2007/0037343 A1 | 2/2007 | Colombo et al. | |
| 2007/0077705 A1 | 4/2007 | Prinz et al. | |
| 2007/0115725 A1 | 5/2007 | Pham et al. | |
| 2007/0215917 A1 | 9/2007 | Taniguchi | |
| 2007/0218633 A1 * | 9/2007 | Prinz et al. | 438/267 |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1 | 3/2008 | Tsutsumi et al. | |
| 2008/0105945 A1 | 5/2008 | Steimle et al. | |
| 2008/0121983 A1 | 5/2008 | Seong et al. | |
| 2008/0128785 A1 | 6/2008 | Park et al. | |
| 2008/0145985 A1 | 6/2008 | Chi | |
| 2008/0185635 A1 | 8/2008 | Yanagi et al. | |
| 2008/0237690 A1 | 10/2008 | Anezaki et al. | |
| 2008/0237700 A1 | 10/2008 | Kim et al. | |
| 2008/0283900 A1 | 11/2008 | Nakagawa et al. | |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111226 A1 * | 4/2009 | Chindalore | 438/258 |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256186 A1 * | 10/2009 | Kang et al. | 257/314 |
| 2009/0256211 A1 | 10/2009 | Booth, Jr. et al. | |
| 2009/0269893 A1 | 10/2009 | Hashimoto et al. | |
| 2009/0273013 A1 * | 11/2009 | Winstead et al. | 257/315 |
| 2009/0278187 A1 | 11/2009 | Toba | |
| 2010/0244121 A1 * | 9/2010 | Loiko et al. | 257/325 |
| 2010/0248466 A1 * | 9/2010 | Loiko et al. | 438/593 |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0256705 A1 * | 10/2011 | Kang et al. | 438/591 |
| 2011/0260258 A1 | 10/2011 | Zhu et al. | |
| 2012/0034751 A1 | 2/2012 | Ariyoshi et al. | |
| 2012/0104483 A1 * | 5/2012 | Shroff et al. | 257/324 |
| 2012/0132978 A1 | 5/2012 | Toba et al. | |
| 2012/0142153 A1 | 6/2012 | Jeong | |
| 2012/0248523 A1 * | 10/2012 | Shroff et al. | 257/316 |
| 2012/0252171 A1 * | 10/2012 | Shroff et al. | 438/129 |
| 2012/0261769 A1 * | 10/2012 | Hong et al. | 257/410 |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0082315 A1 * | 4/2013 | Hosoda et al. | 257/315 |
| 2013/0084684 A1 | 4/2013 | Ishii et al. | |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 * | 7/2013 | Hall et al. | 438/258 |
| 2013/0178054 A1 | 7/2013 | Shroff et al. | |
| 2013/0264633 A1 | 10/2013 | Hall et al. | |
| 2013/0264634 A1 | 10/2013 | Hall et al. | |
| 2013/0267072 A1 | 10/2013 | Hall et al. | |
| 2013/0267074 A1 | 10/2013 | Hall et al. | |
| 2013/0313625 A1 * | 11/2013 | Kao | 257/319 |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |
| 2014/0213030 A1 * | 7/2014 | Tsukuda | H01L 29/66833 438/287 |
| 2014/0357072 A1 * | 12/2014 | Shen et al. | 438/591 |
| 2015/0035034 A1 * | 2/2015 | Winstead et al. | 257/314 |
| 2015/0048439 A1 * | 2/2015 | Shum et al. | 257/326 |
| 2015/0054044 A1 * | 2/2015 | Perera et al. | 257/314 |
| 2015/0072489 A1 * | 3/2015 | Baker et al. | 438/267 |

OTHER PUBLICATIONS

U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.

(56) References Cited

OTHER PUBLICATIONS

U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action—Allowance, mailed Oct. 17, 2014.
U.S. Appl. No. 13/790,225, Office Action—Allowance, Dec. 24, 2013.
U.S. Appl. No. 13/790,014, Office Action—Allowance, Dec. 24, 2013.
U.S. Appl. No. 13/442,142, Office Action—Allowance, Dec. 31, 2013.
U.S. Appl. No. 13/491,771, Office Action—Allowance, Jan. 16, 2014.
U.S. Appl. No. 13/781,727, Office Action—Allowance, Jan. 31, 2014.
U.S. Appl. No. 13/441,426, Office Action—Allowance, Feb. 21, 2014.
U.S. Appl. No. 13/442,142, Office Action—Allowance, Feb. 28, 2014.
U.S. Appl. No. 13/790,014, Office Action—Allowance, Mar. 3, 2014.
U.S. Appl. No. 13/907,491, Office Action—Allowance, Mar. 11, 2014.
U.S. Appl. No. 13/790,225, Office Action—Allowance, Mar. 12, 2014.
U.S. Appl. No. 13/781,727, Office Action—Allowance, May 12, 2014.
U.S. Appl. No. 13/343,331, Office Action—Allowance, Nov. 8, 2013.
U.S. Appl. No. 14/195,299, Shroff, M., et al., "Method of Making a Logic Transistor and a Non-Volatile Memory (NVM) Cell", filed Mar. 3, 2014.
U.S. Appl. No. 14/228,672, Hall, M.D., et al., "Method of Forming a Split-Gate Device", filed Mar. 28, 2014.
U.S. Appl. No. 14/228,678, Hall, M.D., et al., "Method of Forming a Split-Gate Device", filed Mar. 28, 2014.
U.S. Appl. No. 14/228,682, Shroff, M., et al., "Method of Forming a Split-Gate Device", filed Mar. 28, 2014.
U.S. Appl. No. 13/441,426, Shroff, M. D., et al., Office Action—Allowance, mailed Jun. 9, 2014.
U.S. Appl. No. 13/491,771, Office Action mailed Mar. 6, 2014.
Chen, J.H., et al., "Nonvolatile Flash Memory Device Using Ge Nanocrystals Embedded in HfA1O High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO—SiO2 tunnel layer", Sciencedirect. com, Solid-State Electronics, vol. 61, Issue 1, Jul. 2011, pp. 100-105, http://wwww.sciencedirect.com/science/article/pii/S0038110111000803.
Krishnan, S., et al.., "A Manufacturable Dual Channel (Si and SiGe) High-K Metal Gate CMOS Technology with Multiple Oxides for High Performance and Low Power Applications", IEEE, Feb. 2011 IEEE International Electron Devices Meeting (IEDM), 28.1.1-28.1.4, pp. 634-637.
Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.
Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.
Mao, P., et al. "Nonvolatile Memory Characteristics with Embedded high Density Ruthenium Nanocrystals", http://iopscience.iop.org/0256-307X/26/5/056104, Chinese Physics Letters, vol. 26, No. 5, 2009.
Pei, Y., et al., "MOSFET nonvolatile Memory with High-Density Cobalt-Nanodots Floating Gate and Hf02 High-k Blocking Dielectric", IEEE Transactions of Nanotechnology, vol. 10, No. 3, May 2011, pp. 528-531.
Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Office Action—Allowance—May 3, 2013.
U.S. Appl. No. 13/789,971, Office Action—Allowance—May 15, 2013.
U.S. Appl. No. 13/491,771, Office Action—Rejection, Sep. 9, 2013.
U.S. Appl. No. 13/442,142, Office Action—Ex Parte Quayle, Apr. 4, 2013.
U.S. Appl. No. 13/442,142, Office Action—Allowance, Aug. 2, 2013.
U.S. Appl. No. 13/907,491, Office Action—Rejection, Sep. 3, 2013.
U.S. Appl. No. 12/915,726, Office Action—Restriction, Jul. 31, 2012.
U.S. Appl. No. 12/915,726, Office Action—Allowance, Dec. 10, 2012.
U.S. Appl. No. 13/781,727, Office Action—Rejection, Aug. 22, 2013.
U.S. Appl. No. 13/077,491, Office Action—Rejection, Aug. 15, 2012.
U.S. Appl. No. 13/077,491, Office Action—Rejection, Feb. 6, 2013.
U.S. Appl. No. 13/077,491, Office Action—Allowance, Jun. 18, 2013.
U.S. Appl. No. 13/077,501, Office Action—Allowance, Nov. 26, 2012.
U.S. Appl. No. 13/313,179, Office Action—Rejection, Aug. 15, 2013.
U.S. Appl. No. 13/307,719, Office Action—Allowance, May 29, 2013.
U.S. Appl. No. 13/343,331, Office Action—Rejection, Mar. 13, 2013.
U.S. Appl. No. 13/343,331, Office Action—Allowance, Jun. 24, 2013.
U.S. Appl. No. 13/441,426, Office Action—Allowance, Sep. 9, 2013.
U.S. Appl. No. 13/780,574, Office Action—Allowance, Sep. 6, 2013.
U.S. Appl. No. 13/491,760, Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 14/041,591, Perera, A.H., "Non-Volatile Memory (NVM) and High K and Metal Gate Integration Using Gate Last Methodology", filed Sep. 30, 2013.
U.S. Appl. No. 13/971,987, Perera, A.H., et al., "Integrated Split Gate Non-Volatile Memory Cell and Logic Structure", filed Aug. 21, 2013.
U.S. Appl. No. 13/972,372, Perera, A.H., et al., "Integrated Split Gate Non-Volatile Memory Cell and Logic Device", filed Aug. 21, 2013.
U.S. Appl. No. 14/041,647, Perera, A.H., et al., "Non-Volatile Memory (NVM) and High-K and Metal Gate Integration Using Gate-First", filed Sep. 30, 2013.
U.S. Appl. No. 14/041,662, Perera, A. H., et al., "Non-Volatile Memory (NVM) and High-K and Metal Gate Integration Using Gate-Last Methodology", filed Sep. 30, 2013.

(56) References Cited

OTHER PUBLICATIONS

U.S. Appl. No. 13/962,338, Perera, A.H., "Nonvolatile Memory Bitcell With Inlaid High K Metal Select Gate", filed Aug. 8, 2013.

U.S. Appl. No. 13/973,433, Perera, A.H., et al., "Method to Form a Polysilicon Nanocrystal Thin Film Storage Bitcell Within a High K Metal Gate Platform Technology Using a Gate Last Process to Form Transistor Gates", filed Aug. 22, 2013.

U.S. Appl. No. 13/928,666, Hong, C. M., et al., "Non-Volatile Memory (NVM) and High Voltage Transistor Integration", filed Jun. 27, 2013.

U.S. Appl. No. 14/023,440, Baker, F.K., Jr., et al., "Non-Volatile Memory (NVM) Cell and High-K and Metal Gate Transistor Integration", filed Sep. 10, 2013.

U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.

U.S. Appl. No. 13/973,549, Hong, C.M., et al., "Split-Gate non-Volatile Memory (NVM) Cell and Device Structure Integration", filed Aug. 22, 2013.

U.S. Appl. No. 13/780,591, Hall, M.D., et al., "Non-Volatile Memory (NVM) and Logic Integration", filed Feb. 28, 2013.

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", filed Oct. 26, 2012.

U.S. Appl. No. 13/781,727, Office Action—Restriction, Jun. 21, 2013.

U.S. Appl. No. 13/780,591, Office Action—Allowance, Nov. 22, 2013.

* cited by examiner

FIG. 8

# METHOD OF MAKING A SPLIT GATE NON-VOLATILE MEMORY (NVM) CELL AND A LOGIC TRANSISTOR

BACKGROUND

1. Field

This disclosure relates generally to integrated non-volatile memory (NVM) and logic transistor manufacturing, and more specifically, to the making split gate NVM cells integrated with high-k, metal gate (HKMG) logic transistors.

2. Related Art

Non-volatile memories (NVMs) have become very significant in the semiconductor industry and thus the manner of making them has also become very significant. On the same integrated circuits are logic transistors, and in cases where the NVM is embedded in a much larger system, the logic transistor performance is the dominant concern. The cost of making the NVM is accordingly kept as low as possible while achieving the needed performance. Ways of achieving this normally includes using techniques that can be implemented with commonly available equipment and using materials that are well characterized. An effective approach for achieving the desired performance has been found to be the use of split gate NVM cells which utilize a select gate and a control gate over a continuous channel while using HKMG transistors for the logic transistors.

Accordingly there is a need to provide further improvement in achieving both low cost and high performance for split gate NVM cells in an integration with high-k, metal gate transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a split gate NVM cell and logic transistor is formed by first forming a control gate over a charge storage layer in an NVM region. A stack of a high-k dielectric, a metal gate material, and a conductive layer is formed over both the NVM region and a logic region. The stack is patterned to leave a portion of the stack in the logic region as a logic gate and a portion adjacent to the control gate as the select gate. The conductive layer is removed from the select gate while leaving the conductive layer as part of the logic gate. A stressor layer is deposited over the logic region and the NVM region. The result is that source/drains adjacent to the logic gate are in relatively close proximity to the stressor layer while the channel of the logic transistor is significantly further from the stressor layer due to the logic gate having the conductive layer between the channel and the stressor layer. The result is that a first type of stress is applied to the source/drains which in turn results in a second type of stress, which is opposite the first type of stress, is applied to the channel of the logic transistor. For the NVM cell, the result is that the source/drain adjacent to the control gate is in relatively close proximity to the stressor layer, that the portion of the channel of the NVM cell under the select gate is in relatively close proximity to the stressor layer due to the removal of the conductive layer from the select gate, and the portion of the channel under the control gate is significantly further from the stressor layer. The stressor layer thus applies the first type of stress to the source/drain adjacent to the control gate and to the portion of the channel of the NVM cell under the select gate which results in the second type of stress being applied to the portion of the channel of the NVM cell under the control gate. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
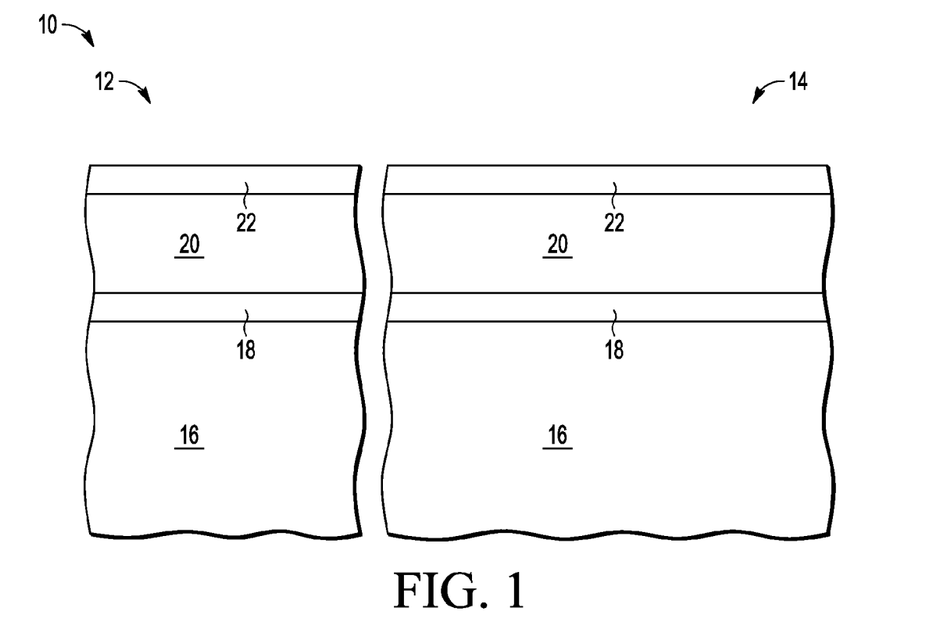
FIG. 1 is a cross section of a split gate non-volatile memory (NVM) cell and logic transistor according to a first embodiment at a stage in processing.

FIG. 1 is a partial cross-sectional view of a first example semiconductor device or structure 10 formed on a semiconductor substrate 16, which includes a logic region 12 and a non-volatile memory (NVM) region 14. Logic region 12 includes an area in which logic devices (e.g., CMOS, PMOS, NMOS transistors) are generally formed. NVM region 14 includes an area in which non-volatile memory devices (e.g., NVM bitcells) are generally formed. Though various structures and layer regions are illustrated throughout the figures with straight lines and curved or corner regions, it will be appreciated that the actual profile(s) for the different structures and layer regions will not necessarily conform to simplified depictions, but will instead depend on the specific fabrication process(es) used. In addition, the depicted device structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). The semiconductor substrate described herein can be any semiconductor material or combinations of materials, such as gallium arsenide, silicon germanium, silicon-on-insulator (SOI), silicon, monocrystalline silicon, the like, and combinations of the above.

As described below, one or more split gate thin film storage non-volatile memory bitcells may be formed in NVM region 14 with one or more control gates and one or more HKMG select gates using any desired processing steps. A non-limiting example of processing steps that may be used is provided herein. In the semiconductor structure 10, a charge storage layer 18 is formed over substrate 16 (e.g., deposited over the entirety of the substrate). Charge storage layer 18 includes discrete storage elements, such as silicon nanocrystals. In other embodiments, the discrete storage elements are made of other types of materials, such as, for example, polysilicon nanocrystals, silicon germanium nanocrystals, nanoclusters of a metal (e.g. gold, ruthenium, nickel, cobalt, tungsten), or nanoclusters of a silicide (e.g. cobalt silicide, nickel silicide). The discrete storage elements are used to selectively store charge introduced during a programming operation to selectively adjust a voltage threshold of a transistor depending upon whether a "1" or "0" value is to be stored in the memory cell. In selected embodiments, the charge storage layer 18 is formed as a nanocrystal stack, thereby forming a polysilicon-nitrided-silicon dioxide (poly-SiON) stack. While any desired charge storage layer sequence may be used, in selected example embodiments, the charge storage layer 18 may include an insulating layer formed over the substrate 16, such as by depositing a high-k dielectric layer or other appropriate insulating layer to a predetermined thickness (e.g., approximately 40-150 Angstroms), though other thicknesses may be used. On the insulating layer, a layer of conductive nanocrystals may be formed, where the nanocrystals having predetermined diameters (e.g., approximately 3-10 nanometers) and spacing (e.g., about 5 nanometers apart). After depositing the nanocrystals, another insulating layer is formed over and around the nanocrystals, such as by depositing a suitable high-k dielectric with a low pressure chemical vapor deposition (LPCVD) to a predetermined thickness (e.g., approximately 100-200 Angstroms), though other materials or thicknesses may be used.

Subsequently, a first conductive layer 20 that forms a control gate layer is formed over charge storage layer 18 (e.g., deposited over the entirety of the substrate). Conductive layer 20 may be polysilicon and may be referenced as a poly layer. Poly layer 20 may be deposited as a doped poly layer, or may be subsequently doped with appropriate impurities to make poly layer 20 conductive. It is noted that poly layer 20 may be thinner than a traditional control gate poly layer. Subsequently, a capping layer 22 is formed over poly layer 20 (e.g., deposited over the entirety of substrate 10). Capping layer 22 may be an anti-reflective coating (ARC) material, such as silicon nitride.

Figure 2:
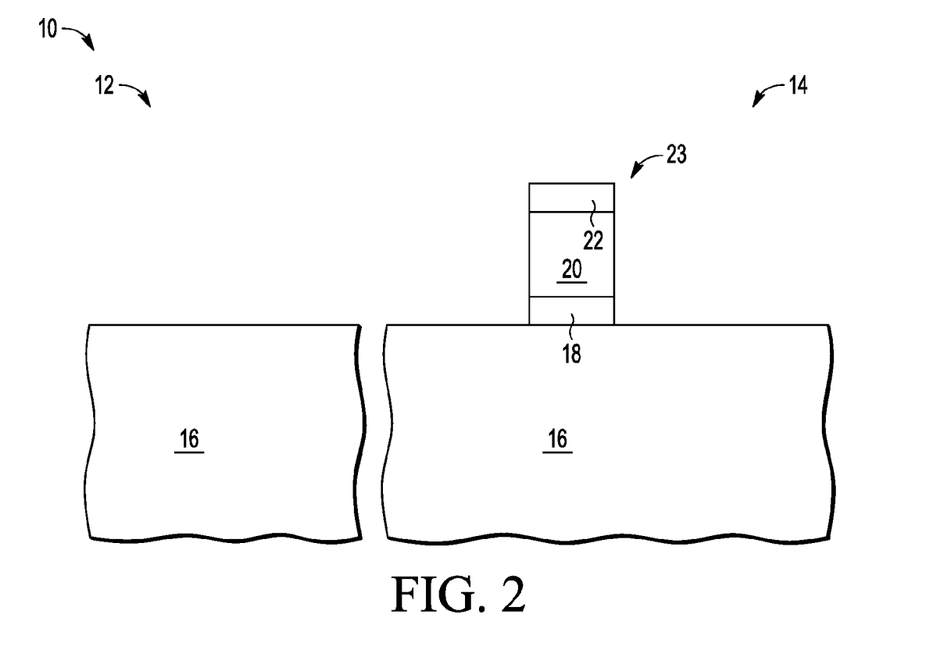
FIG. 2 is a cross section of the split gate NVM cell and logic transistor of FIG. 1 at a subsequent stage in processing.

FIG. 2 illustrates processing of semiconductor structure 10 subsequent to FIG. 1. One or more control gate stacks 23 are formed in NVM region 14 by patterning and etching charge storage layer 18, poly layer 20, and capping layer 22. For example, a patterned etch mask is placed over the intended control gate region(s) and is used to etch and remove exposed regions of charge storage layer 18, poly layer 20, and capping layer 22 to form one or more control gate stacks 23 in NVM region 14. Although not shown, the patterned etch mask may be formed by patterning a photoresist layer or other hard mask layer, which is formed on the capping layer 22 to protect the intended control gate regions(s). The exposed regions are then selectively etched with a dry etch, such as a reactive ion etch process. Any etch mask or photoresist layers are then stripped or removed from the one or more control gate stacks 23. As will be appreciated, any desired gate patterning and etch sequence may be used to form one or more control gate stacks 23, including but not limited to photoresist or a hard mask formation, TEOS etch (using the photoresist as a mask), ARC etch (using the remnant TEOS as a mask), pre-etch cleaning, oxide break through, main poly plasma etch, soft landing etch, poly clean overetch, and post-etch cleaning.

Figure 3:
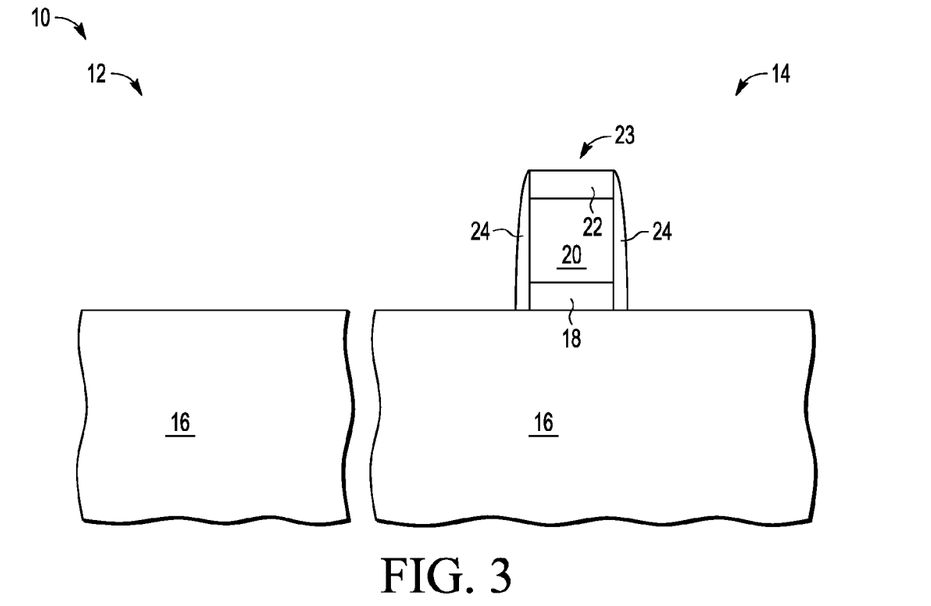
FIG. 3 is a cross section of the split gate NVM cell and logic transistor of FIG. 2 at a subsequent stage in processing.

FIG. 3 illustrates processing of semiconductor structure 10 subsequent to FIG. 2. A first set of sidewall spacers 24 are formed around control gate stack 23 in NVM region 14. For example, one or more dielectric layers (e.g., silicon dioxide or nitride) are formed over the substrate including over the one or more control gate stacks 23 (e.g., deposited over the entirety of the substrate) and are anisotropically etched to form sidewall spacers 24.

Figure 4:
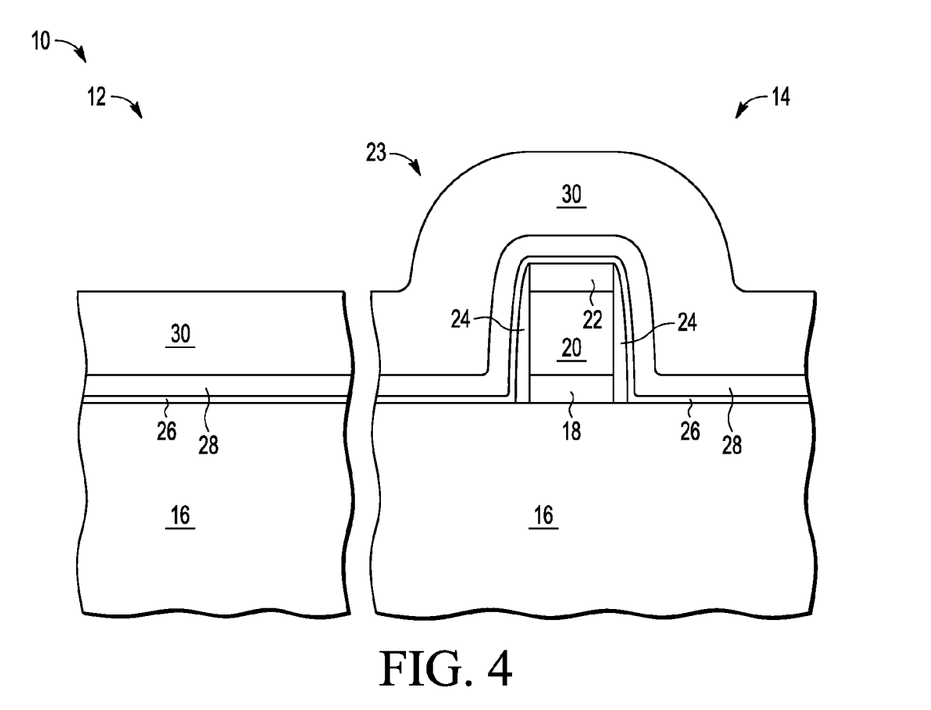
FIG. 4 is a cross section of the split gate NVM cell and logic transistor of FIG. 3 at a subsequent stage in processing.

Shown in FIG. 4 is semiconductor structure 10 after depositing a high-k dielectric layer 26 over NVM region 14 and logic region 12 which is over substrate 16. A portion of high-k dielectric layer 26 in NVM region 14 is over control gate stack 23 and according along the sides of sidewall spacer 24. Also shown in FIG. 4 is semiconductor structure 10 after depositing a metal gate layer 28 over high-k dielectric layer 26 in NVM region 14 and logic region 12 and after depositing a conductive layer 30, which may be poly, over metal gate layer 28. Metal gate layer may contain different layers that include metal such as a barrier layer directly on high-k dielectric layer 26 and a thicker metal-containing layer having a different composition than the barrier layer. In such a case, the barrier layer may be used as a work-function setting material. Conductive layer 30 is thicker than metal gate layer 28. Preferably, metal gate layer 28 plus high-k dielectric layer 26 is thinner than charge storage layer 18, which may be easier to achieve if charge storage layer 18 comprises nanocrystals.

Figure 5:
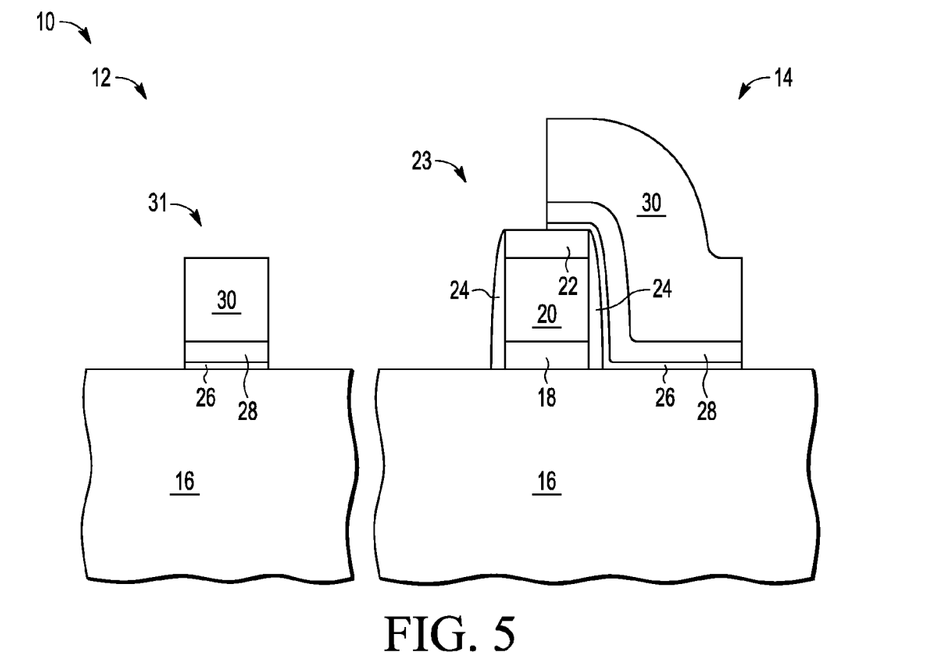
FIG. 5 is a cross section of the split gate NVM cell and logic transistor of FIG. 4 at a subsequent stage in processing.

Shown in FIG. 5 is semiconductor structure 10 after patterning conductive layer 30, metal gate layer 28, and high-k dielectric layer 36. The result is a logic gate stack 31 over substrate 16 in logic region 12 and a portion of conductive layer 30, metal gate layer 26, and high-k dielectric layer 26 over a portion of control gate stack 23, along a first side of sidewall spacer 24, and over a portion of substrate adjacent to the first side of sidewall spacer 24.

Figure 6:
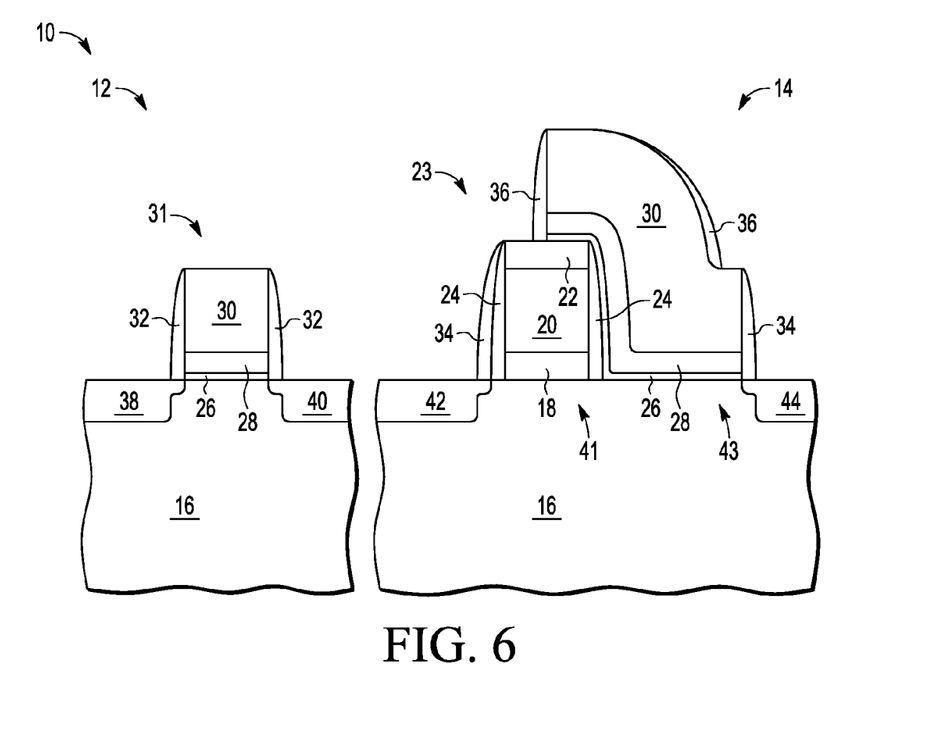
FIG. 6 is a cross section of the split gate NVM cell and logic transistor of FIG. 5 at a subsequent stage in processing.

Shown in FIG. 6 is semiconductor structure 10 after sidewall spacers and source/drains. Sidewall spacer 32 is formed around logic gate stack 31. A sidewall spacer 34 is formed adjacent to control gate stack 23 and adjacent to the portion of conductive layer 30, metal gate layer 26, and high-k dielectric layer 26 that is over the portion of substrate 16 adjacent to the first side of sidewall spacer 24. A sidewall spacer 36 is formed around an upper portion of the portion of conductive layer 30, metal gate layer 26, and high-k dielectric layer 26 in NVM region 14. Source/drains 38 and 40 are formed in substrate 16 in logic region 12 adjacent to the sides of logic gate stack 31. A source/drain 42 is formed in substrate 16 in NVM region 14 adjacent to a side of sidewall spacer 24 that is adjacent to control gate stack 23. A source/drain 44 is formed in substrate 16 in NVM region 14 adjacent to the portion of conductive layer 30, metal gate layer 28, and high-k dielectric layer 26 that is over the portion of substrate 16 adjacent to the first side of sidewall spacer 24. This results in a control gate channel region 41 in substrate 16 under control gate stack 23 and select gate channel region 43 under the portion of conductive layer 30, metal gate layer 28, and high-k dielectric layer 26 that is over the portion of substrate 16 adjacent to the first side of sidewall spacer 24. This also results in a logic channel region in substrate 16 that is under logic gate stack 31.

Figure 7:
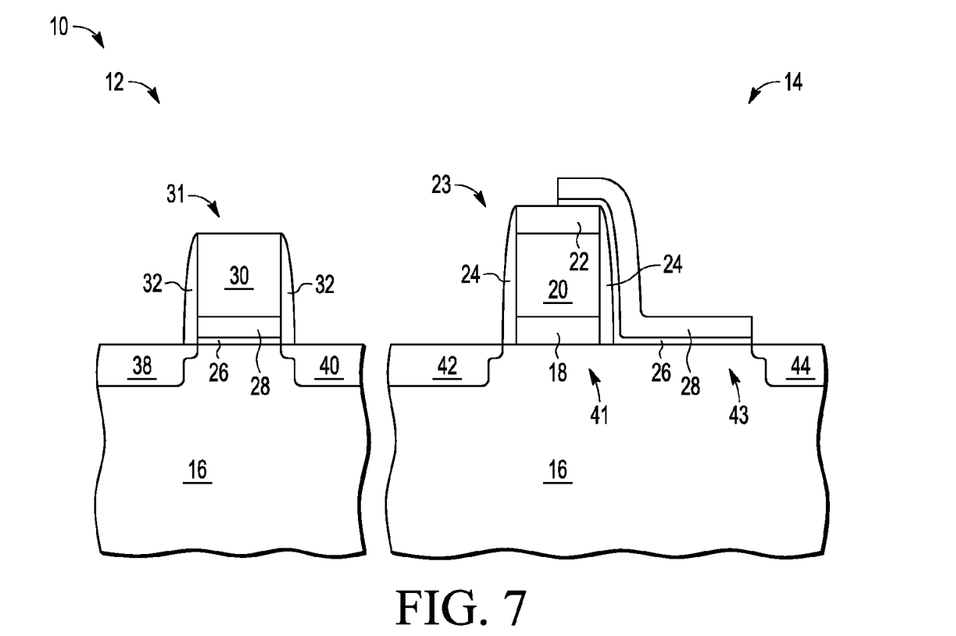
FIG. 7 is a cross section of the split gate NVM cell of and logic transistor FIG. 6 at a subsequent stage in processing.

Shown in FIG. 7 is semiconductor structure 10 after removing the portion of conductive layer 30 in NVM region 14 to expose a top surface of the portion of metal gate layer 28 adjacent to control gate stack 23. This is a patterned etch so that the portion of conductive layer 30 that is part of logic gate stack 31 is not removed. This etch greatly reduces the height of material above select gate channel 43. Only the thickness of high-k dielectric layer 26 and metal gate layer 28 are above the select gate channel. On the other hand the height of control gate stack, which includes charge storage layer 18, conductive layer 20, and capping layer 22, is above control gate channel region 41. In addition to removing the portion of conductive layer 30 in the NVM region, sidewall spacers 34 and 36 are removed. Sidewall spacers 34 and 36 are preferably of a different material than sidewall spacer 24. For example, sidewall spacers 34 and 36 may be nitride and sidewall spacer 24 may be oxide.

Figure 8:
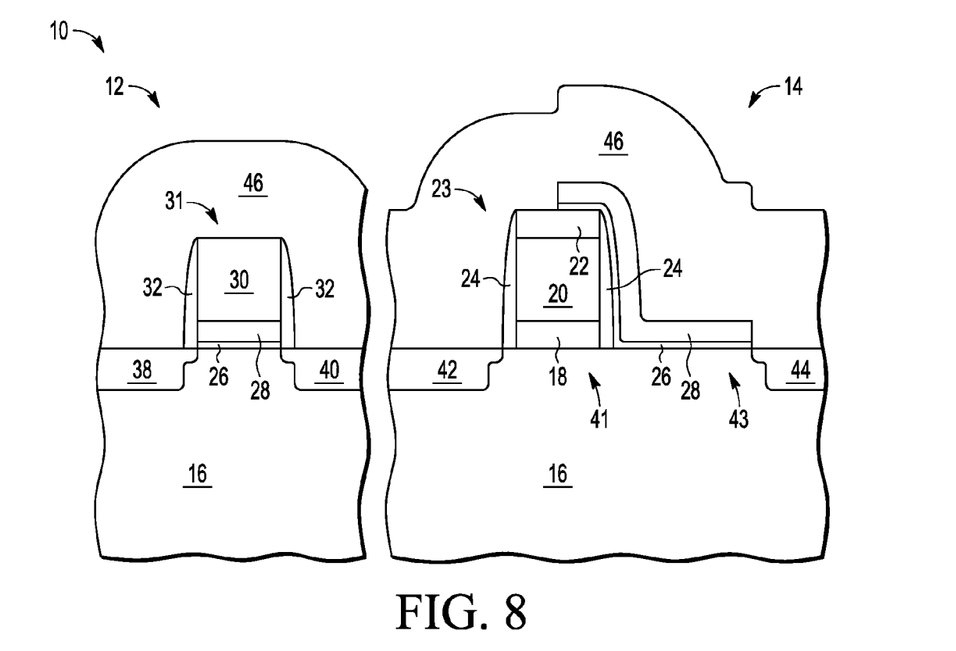
FIG. 8 is a cross section of the split gate NVM cell and logic transistor of FIG. 7 at a subsequent stage in processing.

Shown in FIG. 8 is semiconductor structure 10 after depositing a stressor layer 46 over substrate 16 in logic region 12 and NVM region 14. In addition to being over substrate 16, stressor layer 46 is over logic gate stack 31, control gate stack 23, and metal gate layer 28 in NVM region 14. Stressor layer 46 may be nitride and is useful for increasing the mobility of carriers and thus the performance of transistors. N channel transistors, for example, have increased performance when the channel in the direction of current flow is under tensile stress. Stressor layer 46 is separated from control gate channel region and source/drain 42 by comparatively small distance compared to the separation of stressor layer 46 from control gate channel 41. The stress of stressor layer 46 is chosen so that source/drain regions 38, 40, 42, and 44 and select gate channel region 43 are placed under a desired stress which in this case is compressive stress. In the case of inducing compressive stress in source/drain regions 38, 40, 42, and 44 and select gate channel region 43 stressor layer may be considered to have tensile stress. Stressor layer 46, being a much greater distance from the logic gate channel and control gate channel 41, applies minimal stress to the logic gate channel and control gate channel region 41. The compressive stress, or at least less tensile stress, of source/drain regions 38 and 40 results in the channel under logic gate stack 31 being tensile, or at least less compressive, and thus enhancing for an N channel transistor. The compressive stress, or at least less tensile stress, of source/drains 42 and 44 and select gate channel region 43 results in control gate channel region 41 being tensile, or at least less compressive, and thus enhancing for the control gate transistor. This also results in charge storage layer 18 responding to this compressive stress by becoming more tensile laterally, or at least less compressive laterally. Particularly with having relatively thick charge storage layer 18, the control gate transistor inherently has a significantly lower Gm than does the select gate transistor that has a high-k dielectric. An improvement in the mobility in control gate channel region has much more impact in the overall Gm of the memory device than does a corresponding decline in the mobility in the select gate channel. The overall mobility of the NVM cell is a type of sum of the mobility of control gate channel region 41 and select gate channel region 43. The select gate channel region mobility is much greater than that of the control gate region mobility. Any percentage increase in performance of the control gate will have a bigger effect on the overall performance of the NVM cell than the same percentage decrease in the select gate channel region mobility.

Thus it is seen that the removal of the portion of conductive layer 30 in NVM region 14 gives greater stress transfer to the select gate channel region 43. The result is increased compressive stress, or at least reduced tensile stress, in select gate channel region 43 and a corresponding increase in the tensile stress, or at least reduced compressive stress, in control gate channel region 41. The increase in mobility in control gate channel region 41 more than offsets the decrease in mobility in select gate channel region 43 to result in an overall increase in the net mobility combining the select gate and control gate channel regions being series. In addition, for the NVM cell, charge retention is improved with tensile stress on the charge storage layer. In improving both charge retention and mobility, the desired stress is a lateral stress running in the channel direction.

By now it is apparent that a method of making a semiconductor structure using a substrate has been disclosed, wherein the semiconductor structure comprises a split gate non-volatile memory (NVM) cell in an NVM region of the substrate, The method further includes forming a charge storage layer over the substrate. The method further includes depositing a first conductive layer over the charge storage layer. The method further includes patterning the capping layer, the first conductive layer, and the charge storage layer to form a control gate stack in the NVM region. The method further includes depositing a capping layer over the first conductive layer. The method further includes forming a high-k dielectric layer over the substrate including over the control gate stack. The method further includes forming a metal layer over the high-k dielectric layer. The method further includes depositing a second conductive layer over the metal layer. The method further includes patterning the second conductive layer and the metal layer to form a remaining portion of the second conductive layer and a remaining portion of the metal layer over a portion of the control gate stack and adjacent to a first side of the control gate stack. The method further includes removing the remaining portion of the second conductive layer to form a select gate stack, wherein the select gate stack comprises the remaining portion of the metal layer. The method further includes depositing a stressor layer over the substrate including over the control gate stack and over the select gate stack. The method may further include forming an insulating sidewall spacer on each side of the control gate stack prior to the forming the high-k dielectric layer. The method may have a further characterization by which the semiconductor structure further comprises a logic transistor in a logic region of the substrate, the method further include removing the capping layer, the first conductive layer, and the charge storage layer from the logic region prior to forming the high-k dielectric layer. The method may further include patterning the second conductive layer, the metal layer, and the high-k dielectric layer to form a logic gate stack in the logic region. The method may further include forming a first set of sidewall spacers on sides of the logic gate stack prior to the depositing the stressor layer and forming a second set of sidewall spacers on sides of the split gate NVM cell prior to the depositing the stressor layer. The method may further include removing the second set of sidewall spacers from each side of the split gate NVM cell prior to the depositing the stressor layer. The method have a further characterization by which the patterning the second conductive layer and the metal layer further includes patterning the high-k dielectric layer to leave a remaining portion of the high-k dielectric layer over the portion of the control gate stack and adjacent to the first side of the control gate stack, wherein the removing the remaining portion of the second conductive layer further leaves the remaining portion of the high-k dielectric layer between the control gate stack and the remaining portion of the metal layer and. The method may have a further characterization by which the select gate stack further comprises the remaining portion of the high-k dielectric layer. The method may have a further characterization by which the stressor layer has tensile stress, the stressor layer induces lateral compressive stress in a channel direction in a first region of the substrate under the select gate stack and in a second region of the substrate adjacent to a second side of the control gate stack, the second side of the control gate stack is on an opposite side of the split gate NVM cell from the select gate stack, the stressor layer has tensile stress, and lateral stress in a first region in the substrate under the select gate stack is less tensile than lateral stress in a second region in the substrate under the control gate stack.

Also disclosed is a semiconductor structure using a substrate having a non-volatile memory (NVM) region. The semiconductor structure further includes a split gate NVM cell. The split gate NVM cell includes a control gate stack comprising a charge storage layer over the substrate, a first conductive layer over the charge storage layer, and a capping layer over the first conductive layer. The split gate NVM cell further includes a select gate stack laterally adjacent to a first side of the control gate stack, the select gate stack comprising a high-k dielectric layer over the substrate, along the first side of the control gate stack, and over a top surface of the control gate stack, and a metal layer over the high-k dielectric layer. The split gate NVM cell further includes a stressor layer over the split gate NVM cell. The semiconductor structure may have a logic region and the semiconductor structure may further include a logic gate stack in the logic region, the logic gate stack comprising the high-k dielectric layer over the substrate, the metal layer over the high-k dielectric layer, and a second conductive layer over the metal layer. The semiconductor structure may further include an insulating sidewall spacer on each side of the logic gate stack. The semiconductor structure may further include the stressor layer over the logic gate stack. The semiconductor structure may further include an insulating sidewall spacer on each side of the control gate stack. The semiconductor structure may further include source/drain implant regions in the substrate adjacent to a second side of the control gate stack and adjacent to a first side of the select gate stack, wherein the second side of the control gate stack is on an opposite side of the split gate NVM cell from the first side of the select gate stack. The semiconductor structure may further include source/drain implant regions in the substrate adjacent to a first side of the logic gate stack and adjacent to a second side of the logic gate stack, wherein the first side of the logic gate stack is opposite from the second side of the logic gate stack.

Disclosed also is a method of making a semiconductor structure using a substrate, wherein the semiconductor structure comprises a split gate non-volatile memory (NVM) structure in an NVM region of the substrate. The method further includes forming a charge storage layer over the substrate. The method further includes depositing a first polysilicon layer over the charge storage layer. The method further includes depositing a capping layer over the first polysilicon layer. The method further includes patterning the capping layer, the first polysilicon layer, and the charge storage layer to leave a control gate stack in the NVM region, wherein the control gate stack comprises remaining portions of the capping layer, the first polysilicon layer, and the capping layer. The method further includes forming a high-k dielectric layer over the substrate including over the control gate stack. The method further includes forming a metal layer over the high-k dielectric layer. The method further includes depositing a second polysilicon layer over the metal layer. The method further includes patterning the second polysilicon layer and the metal layer to leave a remaining portion of the metal layer over the substrate, along a first side of the control gate stack, and over a top surface of the remaining portion of the capping layer, and to leave a remaining portion of the second polysilicon layer over the remaining portion of the metal layer. The method further includes removing the remaining portion of the second polysilicon layer to expose the remaining portion of the metal layer and to leave a select gate stack laterally adjacent to the first side of the control gate stack wherein the select gate stack comprises the remaining portion of the metal layer. The method further includes depositing a stressor layer over the substrate including over the control gate stack and over the remaining portion of the metal layer. The method may have a further characterization by which the patterning the second polysilicon layer and the metal layer further includes patterning the high-k dielectric layer to leave a remaining portion of the high-k dielectric layer over the portion of the capping layer and adjacent to the first side of the control gate stack. The method has a further characterization by which the removing the remaining portion of the second polysilicon layer further leaves the remaining portion of the high-k dielectric layer between the control gate stack and the remaining portion of the metal layer and the select gate stack further comprises the remaining portion of the high-k dielectric layer. The method has a further characterization by which the stressor layer has tensile stress, the stressor layer induces lateral compressive stress in a channel direction in a first region of the substrate under the select gate stack and in a second region of the substrate adjacent to a second side of the control gate stack, the second side of the control gate stack is on an opposite side of the split gate NVM cell from the select gate stack, a third region of the substrate is located under the control gate stack between the first region and the second region, and lateral tensile stress is induced in the third region of the substrate. The method has a further characterization by which the select gate stack is thinner than the charge storage layer of the control gate stack.

Although the invention is described herein with reference to specific embodiments, various modifications and changes can be made without departing from the scope of the present invention as set forth in the claims below. For example, materials used for metal gates and high-k dielectrics as well as other features can be varied. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of making a semiconductor structure using a substrate, wherein the semiconductor structure comprises a split gate non-volatile memory (NVM) cell in an NVM region of the substrate, the method comprising:
   forming a charge storage layer over the substrate;
   depositing a first conductive layer over the charge storage layer;
   depositing a capping layer over the first conductive layer;
   patterning the capping layer, the first conductive layer, and the charge storage layer to form a control gate stack in the NVM region;
   forming a high-k dielectric layer over the substrate including over the control gate stack;
   forming a metal layer over the high-k dielectric layer;
   depositing a second conductive layer over the metal layer;

patterning the second conductive layer and the metal layer to form a remaining portion of the second conductive layer and a remaining portion of the metal layer over a portion of the control gate stack and adjacent to a first side of the control gate stack;

removing the remaining portion of the second conductive layer to form a select gate stack, wherein the select gate stack comprises the remaining portion of the metal layer; and depositing a stressor layer over the substrate including over the control gate stack and over the select gate stack.

2. The method of claim 1, further comprising:
forming an insulating sidewall spacer on each side of the control gate stack prior to the forming the high-k dielectric layer.

3. The method of claim 1, wherein the semiconductor structure further comprises a logic transistor in a logic region of the substrate, the method further comprising:
removing the capping layer, the first conductive layer, and the charge storage layer from the logic region prior to forming the high-k dielectric layer.

4. The method of claim 3, further comprising:
patterning the second conductive layer, the metal layer, and the high-k dielectric layer to form a logic gate stack in the logic region.

5. The method of claim 4, further comprising:
forming a first set of sidewall spacers on sides of the logic gate stack prior to the depositing the stressor layer; and
forming a second set of sidewall spacers on sides of the split gate NVM cell prior to the depositing the stressor layer.

6. The method of claim 5, further comprising:
removing the second set of sidewall spacers from each side of the split gate NVM cell prior to the depositing the stressor layer.

7. The method of claim 1, further comprising:
the patterning the second conductive layer and the metal layer further comprises
patterning the high-k dielectric layer to leave a remaining portion of the high-k dielectric layer over the portion of the control gate stack and adjacent to the first side of the control gate stack, wherein
the removing the remaining portion of the second conductive layer further leaves the remaining portion of the high-k dielectric layer between the control gate stack and the remaining portion of the metal layer, and
the select gate stack further comprises the remaining portion of the high-k dielectric layer.

8. The method of claim 1, wherein
the stressor layer has tensile stress,
the stressor layer induces lateral compressive stress in a channel direction in a first region of the substrate under the select gate stack and in a second region of the substrate adjacent to a second side of the control gate stack,
the second side of the control gate stack is on an opposite side of the split gate NVM cell from the select gate stack,
a third region of the substrate is located under the control gate stack between the first region and the second region, and
lateral tensile stress is induced in the third region of the substrate.

9. The method of claim 1, wherein
the stressor layer has tensile stress, and
lateral stress in a first region in the substrate under the select gate stack is less tensile than lateral stress in a second region in the substrate under the control gate stack.

10. A semiconductor structure using a substrate having a non-volatile memory (NVM) region, comprising:
a split gate NVM cell comprising:
a control gate stack comprising a charge storage layer over the substrate, a first conductive layer over the charge storage layer, and a capping layer over the first conductive layer, and
a select gate stack laterally adjacent to a first side of the control gate stack, the select gate stack comprising a high-k dielectric layer over the substrate, along the first side of the control gate stack, and over a top surface of the control gate stack, and a metal layer over the high-k dielectric layer; and
a stressor layer over the split gate NVM cell.

11. The semiconductor structure of claim 10, the substrate further having a logic region, wherein the semiconductor structure further comprises:
a logic gate stack in the logic region, the logic gate stack comprising the high-k dielectric layer over the substrate, the metal layer over the high-k dielectric layer, and a second conductive layer over the metal layer.

12. The semiconductor structure of claim 11, wherein the semiconductor structure further comprises:
an insulating sidewall spacer on each side of the logic gate stack.

13. The semiconductor structure of claim 11, wherein the semiconductor structure further comprises:
the stressor layer over the logic gate stack.

14. The semiconductor structure of claim 10, wherein the semiconductor structure further comprises:
an insulating sidewall spacer on each side of the control gate stack.

15. The semiconductor structure of claim 10, wherein the semiconductor structure further comprises:
source/drain implant regions in the substrate adjacent to a second side of the control gate stack and adjacent to a first side of the select gate stack, wherein the second side of the control gate stack is on an opposite side of the split gate NVM cell from the first side of the select gate stack.

16. The semiconductor structure of claim 11, wherein the semiconductor structure further comprises:
source/drain implant regions in the substrate adjacent to a first side of the logic gate stack and adjacent to a second side of the logic gate stack, wherein the first side of the logic gate stack is opposite from the second side of the logic gate stack.

17. A method of making a semiconductor structure using a substrate, wherein the semiconductor structure comprises a split gate non-volatile memory (NVM) structure in an NVM region of the substrate, the method comprising:
forming a charge storage layer over the substrate;
depositing a first polysilicon layer over the charge storage layer;
depositing a capping layer over the first polysilicon layer;
patterning the capping layer, the first polysilicon layer, and the charge storage layer to leave a control gate stack in the NVM region, wherein the control gate stack comprises remaining portions of the capping layer, the first polysilicon layer, and the capping layer;
forming a high-k dielectric layer over the substrate including over the control gate stack;
forming a metal layer over the high-k dielectric layer;
depositing a second polysilicon layer over the metal layer;

patterning the second polysilicon layer and the metal layer to leave a remaining portion of the metal layer over the substrate, along a first side of the control gate stack, and over a top surface of the remaining portion of the capping layer, and to leave a remaining portion of the second polysilicon layer over the remaining portion of the metal layer;

removing the remaining portion of the second polysilicon layer to expose the remaining portion of the metal layer and to leave a select gate stack laterally adjacent to the first side of the control gate stack, wherein the select gate stack comprises the remaining portion of the metal layer; and depositing a stressor layer over the substrate including over the control gate stack and over the remaining portion of the metal layer.

18. The method of claim 17, wherein:

the patterning the second polysilicon layer and the metal layer further comprises patterning the high-k dielectric layer to leave a remaining portion of the high-k dielectric layer over the portion of the capping layer and adjacent to the first side of the control gate stack, wherein the removing the remaining portion of the second polysilicon layer further leaves the remaining portion of the high-k dielectric layer between the control gate stack and the remaining portion of the metal layer, and the select gate stack further comprises the remaining portion of the high-k dielectric layer.

19. The method of claim 17, wherein the stressor layer has tensile stress, the stressor layer induces lateral compressive stress in a channel direction in a first region of the substrate under the select gate stack and in a second region of the substrate adjacent to a second side of the control gate stack, the second side of the control gate stack is on an opposite side of the split gate NVM cell from the select gate stack, a third region of the substrate is located under the control gate stack between the first region and the second region, and lateral tensile stress is induced in the third region of the substrate.

20. The method of claim 17, wherein the select gate stack is thinner than the charge storage layer of the control gate stack.

\* \* \* \* \*